United States Patent
Kreuter et al.

(10) Patent No.: US 12,249,672 B2
(45) Date of Patent: Mar. 11, 2025

(54) METHOD FOR MANUFACTURING A SEMICONDUCTOR DEVICE AND OPTOELECTRONIC DEVICE

(71) Applicant: OSRAM Opto Semiconductors GmbH, Regensburg (DE)

(72) Inventors: Philipp Kreuter, Teublitz (DE); Andreas Biebersdorf, Regensburg (DE); Christoph Klemp, Regensburg (DE); Jens Ebbecke, Rohr in Niederbayern OT Helchenbach (DE); Ines Pietzonka, Donaustauf (DE); Petrus Sundgren, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 460 days.

(21) Appl. No.: 17/614,269

(22) PCT Filed: May 19, 2020

(86) PCT No.: PCT/EP2020/063903
§ 371 (c)(1),
(2) Date: Nov. 24, 2021

(87) PCT Pub. No.: WO2020/239524
PCT Pub. Date: Dec. 3, 2020

(65) Prior Publication Data
US 2022/0254957 A1     Aug. 11, 2022

(30) Foreign Application Priority Data
May 28, 2019  (EP) .................................. 19177113

(51) Int. Cl.
H01L 33/30    (2010.01)
H01L 33/00    (2010.01)
H01L 33/02    (2010.01)

(52) U.S. Cl.
CPC ........ H01L 33/305 (2013.01); H01L 33/0062 (2013.01); H01L 33/025 (2013.01)

(58) Field of Classification Search
CPC ...................................................... H01L 33/305
See application file for complete search history.

(56) References Cited

U.S. PATENT DOCUMENTS 5,164,798 A    11/1992  Huang
8,124,986 B2    2/2012  Anzue et al.
(Continued)

FOREIGN PATENT DOCUMENTS

CN    102203967 A    9/2011
CN    103811609 A    5/2014

Primary Examiner — Moazzam Hossain
Assistant Examiner — Hajar Kolahdouzan
(74) Attorney, Agent, or Firm — Slater Matsil, LLP

(57) ABSTRACT

In an embodiment a method for manufacturing a semiconductor device include providing a growth substrate, depositing an n-doped first layer, depositing an active region on the n-doped first layer, depositing a second layer onto the active region, depositing magnesium (Mg) in the second layer and subsequently to depositing Mg, depositing zinc (Zn) in the second layer such that a concentration of Zn in the second layer decreases from a first value to a second value in a first area of the second layer adjacent to the active region, the first area being in a range of 5 nm to 200 nm.

13 Claims, 4 Drawing Sheets

(56) References Cited

U.S. PATENT DOCUMENTS

2006/0128046 A1* 6/2006 Onishi .................... H01S 5/164
　　　　　　　　　　　　　　　　　　　　438/45
2006/0187990 A1* 8/2006 Shin ..................... H01S 5/2231
　　　　　　　　　　　　　　　　　　　　372/45.01

* cited by examiner

METHOD FOR MANUFACTURING A SEMICONDUCTOR DEVICE AND OPTOELECTRONIC DEVICE

This patent application is a national phase filing under section 371 of PCT/EP2020/063903, filed May 19, 2020, which claims the priority of European patent application 19177113.8, filed May 28, 2019, each of which is incorporated herein by reference in its entirety.

TECHNICAL FIELD

The present invention relates to the manufacturing of a semiconductor device, in particular an optoelectronic semiconductor device. The invention also concerns an optoelectronic device.

BACKGROUND

LED applications, particularly for visual appliances as displays are nowadays facing more and more challenging requirements. In one aspect, the electron efficiency in optoelectronic devices, i.e. LEDs and such, that is the portion of electrons and holes that contribute to the overall generation for emission, shall be as high as possible. Such process contributing to the electron efficiency is called radiative recombination process (RRP) compared to the non-radiative recombination process (NRRP). Both are often based on the size of the active region. Particularly, RR-processes are concentrated on the central area of an active region, while NRR-processes occur mainly on edges and are caused by disturbances in the semiconductor structure, i.e. by edges and such.

Further, many LED require to be operated at relatively high current densities. Increasing temperature reduces the efficiency of radiative recombination and increase electron leakage. Hence, there is a need to obtain method and devices, which improve the current efficiency and reduce electron leakage.

SUMMARY

Embodiments provide a method for manufacturing a semiconductor device, particularly an optoelectronic device. The method comprises providing a growth substrate, the growth substrate suitable for growing a semiconductor material onto it. For depositing semiconductor material, several different approaches can be used, including but not limited to CVD, MOVD, MEB and the like. The growth substrate may comprise a similar lattice structure as the material system to be grown. In some instances, the growth substrate is prepared by growing sacrificial layers on top or growing lattice adjustment layers.

In a subsequent step, one or more semiconductor layer may be deposited onto the growth substrate including depositing an n-doped first layer onto the substrate. An active region is deposited onto the n-doped first layer. The active region is configured to emit electromagnetic radiation when the finished device is operated.

In some instances, the active region may be intrinsic or it may be doped.

A second layer is then deposited over the active region. The second layer may be intrinsic as well, but will be at some later stage p-doped. In some instances, the second layer is p-doped when being deposited. For this purpose, Mg is deposited in the second layer. Mg or Magnesium acts as an acceptor, thereby forming a p-dopant. Deposition is done by diffusion doping. In some instances, diffusion is done during deposition of the second layer. In some other instances, the deposition of Mg is performed after deposition of the second layer.

The diffusion process is controlled mainly be three parameters, including concentration of dopant, diffusion temperature and diffusion time. These parameters affect the diffusion length of Mg in the second layer. Hence, by adjusting these parameters, the diffusion length and therefore the concentration profile of the dopant within the second layer can be controlled. In some instances, these parameters are adjusted such, that the concentration of Mg in the second layer is rather low adjacent or close to the active region. In other words, the diffusion length is set such that Mg is deposited in a distance from the active region.

In a subsequent step to the deposition of Mg, a second dopant, particular Zn is deposited in the second layer. The concentration of Zn in the second layer is decreasing from a first value to a second value in a first area of the second layer adjacent to the active region, said first area in the range of 5 nm to 200 nm, in particularly less than 50 nm. In some instance, Zn is deposited in the second layer, such that a concentration profile has an edge with a steep decrease close to the active region It has been found that the Mg dopant in the second layer and the subsequently deposited Zn dopant are exchanging their position in the lattice structure causing a "kick-out" effect of Mg. The effect causes the concentration profile of Zn to drop significantly and with a steep slope in the area between the first dopant in the second layer and the active region.

As a result, the higher dopant concentration with the steep slope close to the active region will result in an improved confinement of charge carriers, resulting in a higher current density. Further, in some embodiments using respective masks during deposition of both dopants, localization of concentration profiles can be achieved with a profile in accordance with the above principle positioned at a central area of a semiconductor die.

In some instances, the slope as well as the position of the Zn dopant edge is adjusted by changing the diffusion temperature of Zn during deposition of Zn. The concentration of Zn may also be used to adjust steepness of the slope. In this regard, the diffusion time of Zn, the concentration of Zn or the diffusion time of Zn may be different compared to the respective parameter when depositing Mg. In some embodiments, one or more diffusion parameters for the Mg depositing may be adjusted such that a diffusion length of Mg is substantially the same as the diffusion length of Zn. Due to the exchange process when depositing Zn, the Mg dopant is replaced by Zn.

In this regard, step of depositing Zn may include adjusting temperature, said temperature being different from the temperature during the depositing step of Mg; and/or adjusting diffusion time; said diffusion time being different from the diffusion time during the depositing step of Mg and/or adjusting a concentration of Zn, the concentration of Zn being different compared to the concentration of Mg. In this regard, adjusting one of these parameters also includes setting up and/or adjusting a respective profile of such parameter. In some instances, the temperature when depositing Zn is lower than the temperature for the diffusion process of Mg.

In some instances, the concentration of Zn in a second area adjacent to the first area after diffusion of the Zn through the second layer is larger than the respective concentration of Mg in said second area. For example, the concentration of Zn in a second area adjacent to the first area may be larger by a factor of 5 to 500. In some instances, the Zn dopants replace the Mg dopants completely in the first and/or second area. In some further instances, the replacement is almost complete in large portions of the second layer.

The declining slope of concentration of Zn in said area closer to the active region may be larger than the slope of concentration of Mg. In some other embodiments, the initial concentration of Mg and Zn for the diffusion may be equal, but due to the replacement process during depositing of Zn, the Mg dopant is replaced in large areas of the second layer. Mg concentration may become large on the surface of the second layer. Zn may also comprise a higher concentration than Mg in some parts of the first area, for example in a part close to the second area.

The second layer may comprise a thickness of 300 nm to 5 μm, particularly larger than 500 nm.

Some other embodiments related to the generation of a barrier layer. In some embodiments, a third semiconductor layer having Al is deposited onto the active region prior to depositing the second layer, wherein a concentration of Al increases with increasing distance to the active region. The second semiconductor layer is then deposited onto the third semiconductor layer. In some instances, the Al concentration may increase from a first value to a second value, the second value concentration adjacent to the second layer. The second layer may then comprise a concentration of Al that is higher than the second value concentration.

In some embodiments, the step of depositing the active region comprises the step of depositing layers having different material composition as to form one or more quantum well structures.

Some other embodiments relate to an optoelectronic device. The optoelectronic device comprises an n-doped first layer, a p-doped second layer and an active region arranged between the n-doped first layer and the p-doped second layer, the active configured to emit radiation in operation of the optoelectronic device. The p-doped second layer comprises Mg as p-dopants having a first concentration profile with a very low concentration towards the active region and further comprising Zn as p-dopant having a second concentration profile with a decreasing concentration towards the active region; the second concentration profile comprises a larger decreasing slope than the first concentration profile.

The thickness in the area in which the concentration is dropping form an initial substantially constant value to the lower second value comprises a thickness of 5 nm to 200 nm, an in particular 5 nm to 25 nm and more particularly below 10 nm.

The second layer of the optoelectronic device may comprise a sublayer adjacent to the active region, the sublayer having a varying concentration of Al. In particular, the Al concentration may increase form an initial level directly adjacent to the active region to a second higher level.

The decreasing slope of the second concentration profile may be located in the sublayer or the decreasing slope of the second concentration profile may be located on the interface of the sublayer and the remaining second layer.

BRIEF DESCRIPTION OF THE DRAWINGS

In the following, the proposed solution will be explained in greater detail using the accompanied drawings in which.

DETAILED DESCRIPTION OF ILLUSTRATIVE EMBODIMENTS

FIGS. 1A to 1G show the manufacturing steps of a semiconductor device in accordance with the proposed principle. In a first step in FIG. 1A, a growth substrate 10 is provided. The growth substrate may comprise a suitable material to grow the subsequent semiconductor layers on top of it. In some instances the growth substrate 10 may comprise a super lattice structure (not shown) deposited on a substrate to act as a sacrificial layer and/or align the lattice structure of the semiconductor layers to the underlying substrate.

Figure 1A:
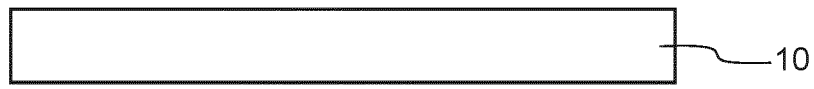
FIG. 1A to 1G illustrate several process step for manufacturing a semiconductor device in accordance with the proposed principle.
Figure 1B:

FIG. 1B illustrates the next step in which a first semiconductor layer 20 is deposited on the growth substrate 10. The semiconductor layer is n-doped. N-doping can be achieved by diffusion- or ion-doping after growing the layer. Alternatively, n-type dopants are provided during growth of the semiconductor layer such that an n-doped layer is grown. By varying the concentration of dopant during growth, a concentration profile can be adapted to the specific needs and requirements. Various techniques for growing such layers can be used as for instance but not limited to MOCVD, CVD, PVD, MBE and the like. One or more of these techniques are also used for subsequent layers. The n-doped layer can have various current distribution sublayers to reduce local electrical resistance in the semiconductor.

Figure 1C:
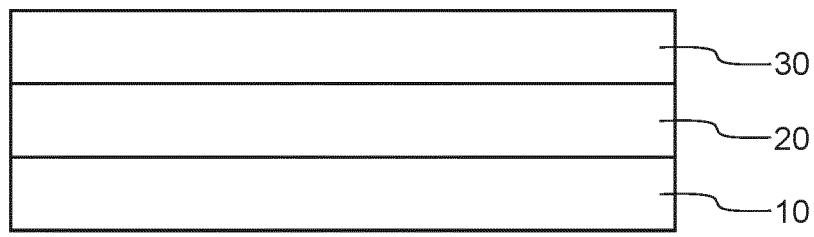

After depositing layer 20, an active region 30 is provided illustrated in FIG. 1C. Active region 30 can be an intrinsic layer that is an undoped layer. In this particular example, active region 30 comprises the same base semiconductor material as layer 20 for instance a material based on InGaAlP, the thickness of the active region 30 is in the range of appr. 100 to 300 nm.

Figure 1D:
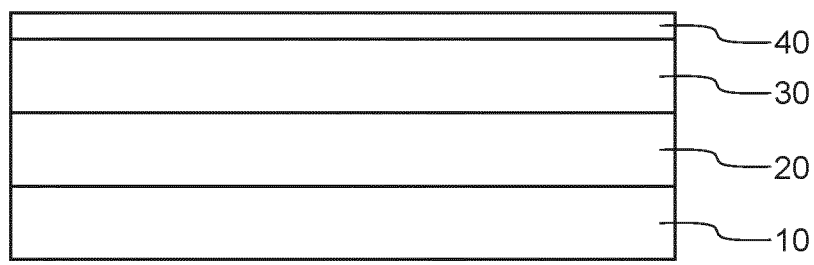

FIG. 1D shows the next step after depositing the active region. A barrier layer 40 is deposited on top of active region 30. The barrier layer 40 has a varying concentration of Al, starting from a value, which is the same as the concentration of Al in the active region 30 to a second higher level. For example, the Al concentration in barrier layer 40 may increase from 40% to about 95% or even 100% resulting in InAlP with no or almost no concentration of Ga. The barrier layer 40 reduces of diffusion of p-dopants like Mg towards the active region.

Figure 1E:
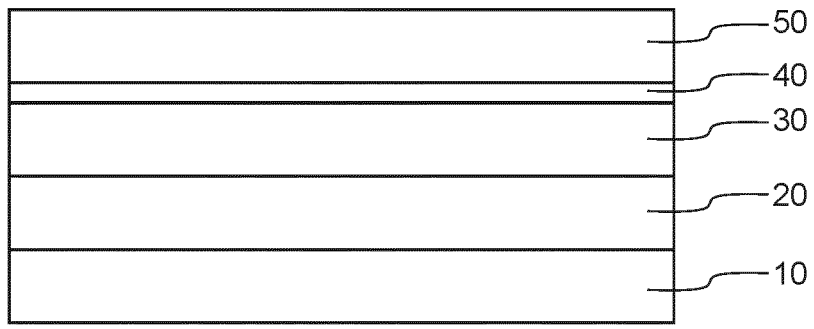
Figure 1F:
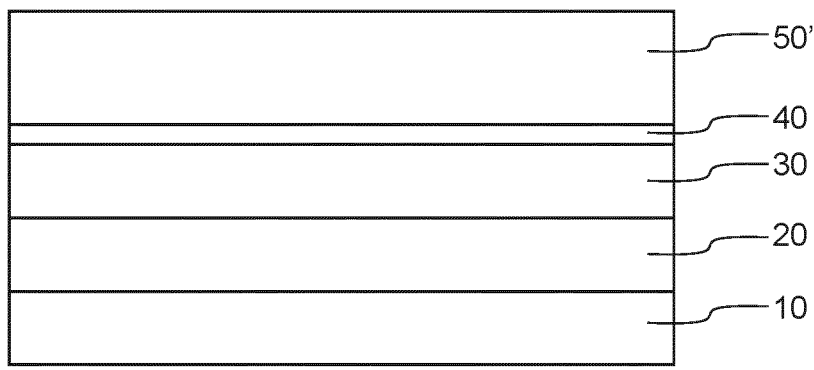

Finally, a second semiconductor layer 50 is deposited onto barrier layer 40 as shown in FIGS. 1E and 1F. The second semiconductor layer will be p-doped with Mg atoms. Similar to above p-doping can be achieved by diffusion- or ion-doping after growing the layer. In case of a diffusion process. The Mg atoms are deposited after the second layer is grown. Concentration of Mg atoms, diffusion temperature and diffusion time can be adjusted such that the Mg concentration has a specified profile within layer 50. Due to the barrier layer 40, the Mg atoms stop in the diffusion process at this location. Continuing the diffusion will result in an equal distribution (e.g. a more straight concentration profile) within the second layer. However closer to barrier 40, the concentration of Mg atoms may drop although the slope of the decrease is not very large.

In an alternative solution, the Mg atoms can also be added in gaseous form during the deposition process. In such case, the concentration of Mg may vary and be adjusted to fulfill the required needs. The Mg concentration may be constant over the growth time. Similar to the above several techniques can be sued including MOCVD, CVD, PVD, MBE and the like. One or more of these techniques are also used for subsequent layers.

Figure 1G:
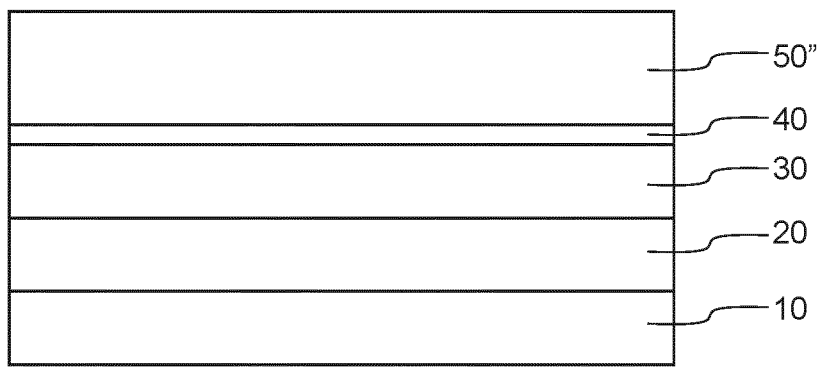

FIG. 1G illustrates the next process step. After n-doping the second layer 50 with Mg atoms forming layer 50', Zn is deposited onto the surface of the second layer. By adjusting the temperature of the semiconductor device to an appropriate temperate a diffusion process of Zn into the second layer takes place. In accordance with the proposed principle, it has been found that the Zn replaces the Mg atoms within the lattice structure of the second layer. By choosing a respective amount of Zn, temperature and diffusion time, Zn will diffuse through the second layer replacing partly or fully the Mg atoms. The concentration slope close to the maximum depth of Mg, i.e. close to barrier layer 40 becomes very steep. During the diffusion process, the Mg concentration in a portion within the second layer decreases due to the replacement while the Zn concentration increases. In some embodiments, the Zn replaces the Mg almost fully. In some further embodiments the concentration of Zn is 5 to 500 times larger than the respective concentration of Mg. This process that is replacement of Mg and diffusion can be controlled such that the slope of Zn concentration is very steep close to the active region. As Zn is like Mg a p-dopant, a strong carrier confinement can be achieved due to the concentration edge adjacent to the active region. After the diffusion process, layer 50" comprises Zn in a certain concentration profile. The semiconductor device can then be process further (not shown herein), for example by structuring the device and or forming contact elements.

Figure 2A:
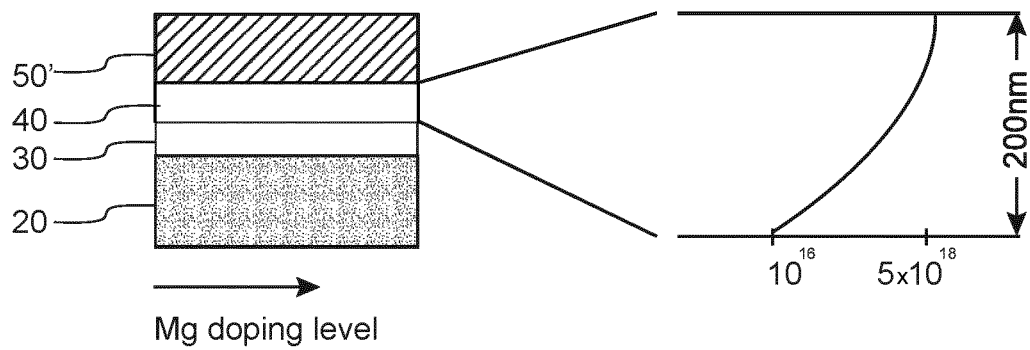
FIG. 2A to 2C show the concentration profile of Mg or Zn in accordance with some embodiments of the proposed solution.
Figure 2B:
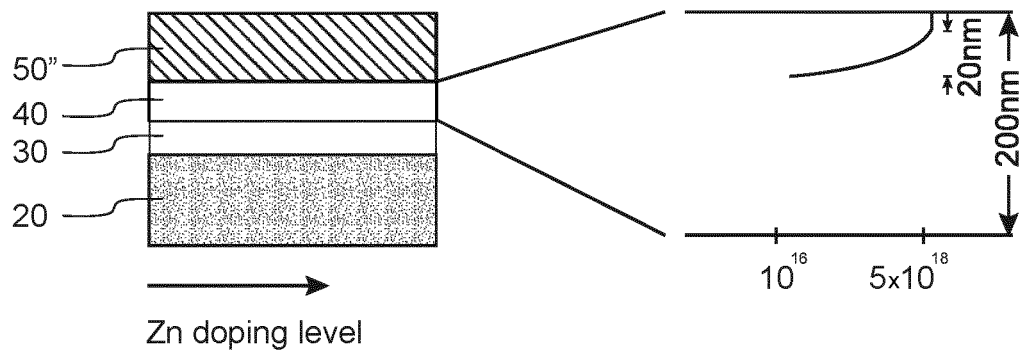
Figure 2C:
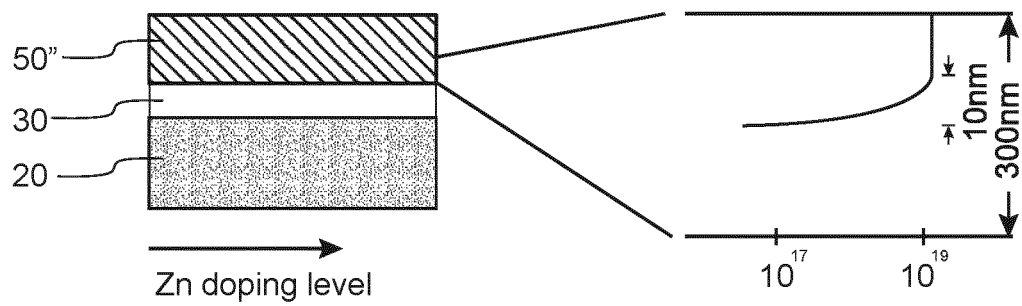

An overview about the different concentration profiles are shown in FIG. 2A to 2C. FIG. 2A illustrates on its left portion a semiconductor device similar to the one explained with respect to FIG. 1. An active region 30 is formed over n-doped first layer 20. A barrier layer 40 with a thickness of approximately 200 nm is deposited onto the active region and a second p-doped layer 50' is formed on top of it.

In the example of FIG. 2A, Mg is used as dopant for the p-doped layer 50'. The concentration of Mg in layer 50 is substantially constant after conduction of the diffusion process. In barrier layer 40, the concentration of Mg dopants drops from an initial value of appr. $5 \times 10^{18}$ cm$^{-3}$ to $1 \times 10^{16}$ cm$^{-3}$. While in this example the decrease in the concentration profile occurs in barrier layer 40, the decrease is also dependent form the initial concentration, the diffusion temperature and the diffusion time. In some instances the Mg concentration can drop significantly already in layer 50' close to barrier layer 40, such that barrier layer 40 effectively prevents diffusion of Mg into the active region.

FIG. 2B illustrate a different example, in which Zn has been diffused into layer 50 after the deposition and diffusion of Mg. Zn has replaced Mg in layer 50 and drops in the barrier layer 40 with a strong decrease in its concentration profile. In comparison with the Mg concentration in FIG. 2A, the concentration of Zn drops from appr. $5 \times 10^{18}$ cm$^{-3}$ to $1 \times 10^{16}$ cm$^{-3}$ in just 20 nm. This strong drop in the concentration causes an edge of p-type carrier close to the active region resulting in a good carrier confinement. The structure reduces carrier leakage and increases high current efficiency. Similar as before, the initial p-type dopant concentration of Zn can be adjusted and set to high values. Even at such high values, allowing a high current, the strong drop in the concentration profile and steep flank in the carrier concentration towards the active region provide good carrier confinements.

During deposition and diffusion of Zn into the second layer, the Zn replaces the previously doped Mg. Hence, the concentration of Zn in the second layer is decreasing from a first value to a second value in a first area, i.e. the barrier layer adjacent to the active region, said first area in the range of 5 nm to 200 nm, in particularly less than 50 nm. In some instances, the barrier layer can be part of the second layer. The concentration of Zn in the second layer may be larger than the concentration of Mg in said layer or areas thereof.

FIG. 2C illustrates a similar example provided a steep flank in the carrier concentration close towards the active region. However, in contrast to the previous examples, the second p-doped layer is formed directly onto the active region without any additional barrier layer. The initial Mg as p-dopant has been replaced by Zn due to the subsequent doping and diffusion step as explained previously. In the present example, initial concentration of Zn, diffusion time and temperate has been set such, that a steep edge in the concentration of Zn is formed at around a distance of 100 nm from the active region. The drop in the concentration occurs over a distance of appr. 10 nm from an initial value of about $10^{19}$ cm$^{-3}$ to less than $10^{17}$ cm$^{-3}$.

Figure 3:
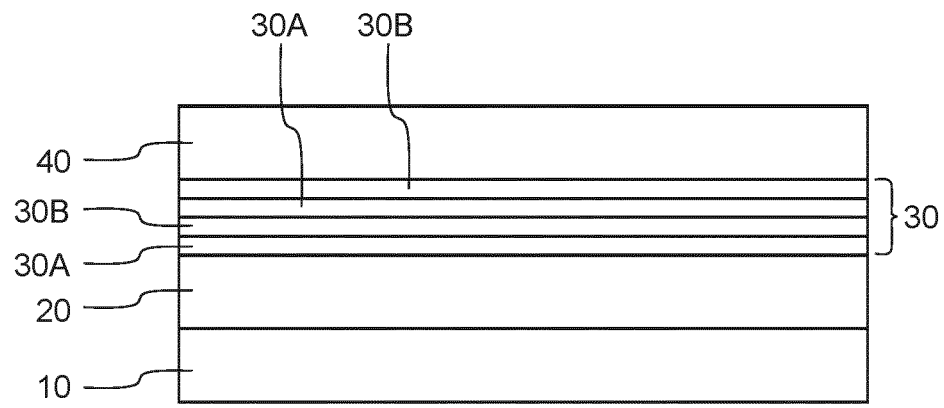
FIG. 3 illustrate a semiconductor device with a quantum well structure.

FIG. 3 shows an example of a quantum well structure as an active region. Similar structures bear the same reference sign as in the previous examples. Active region 30 with its quantum well structure comprises several sublayers 30A and 30B comprising of different Al portion. For example the difference in the Al portion of the InGaAlP structure is 10% varying from InGa$_{0.55}$Al$_{0.45}$P in sublayer 30A to InGa$_{0.45}$Al$_{0.55}$P in sublayer 30B. Adjacent to the upmost sublayer 30B, barrier layer 40 is formed, in which the Al concentration increases from InGa$_{0.45}$Al$_{0.55}$P to InAlP.

Figure 4:
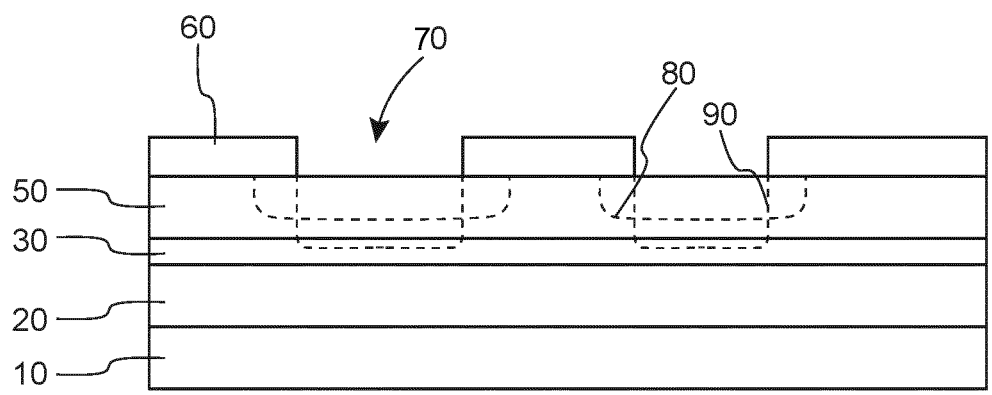
FIG. 4 shows a more detailed view of a manufacturing step of a semiconductor device.
Figure 5:
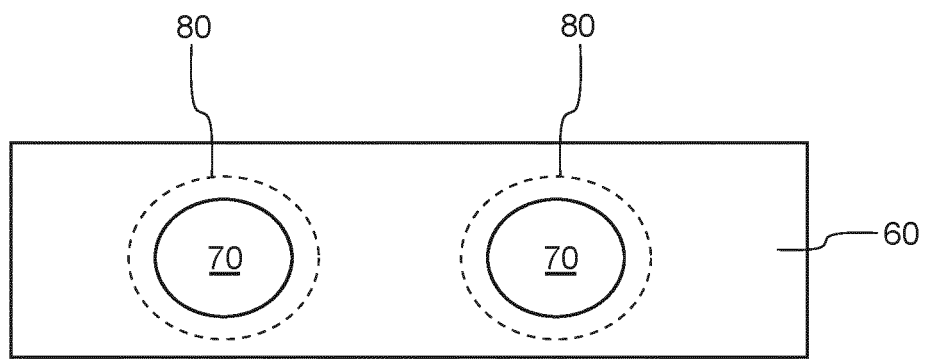
FIG. 5 shows the top view of the structure of FIG. 4.

FIG. 4 shows a side view of a process step of manufacturing a semiconductor device, in particular an optoelectronic device in greater detail. During the manufacturing step a photomask layer 60 is deposited onto second layer 50. The mask is then subsequently structured as to form one or more opening 70. Then Mg is deposited onto the mask and into the openings 70 and subsequently diffused into the second layer. As shown the concentration profile is set that the majority of Mg within second layer 50 form p-doped regions 80. In a subsequent step, Zn is deposited onto the mask and into the openings. Zn is then diffused into the second layer replacing the Mg atoms in that area. Zn forms a second concentration profile with a higher concentration in an area that is slightly smaller but reaches a depth in second layer 50 that is close to active region 30. Setting diffusion temperature and time as well as Zn concentration various profiles can be achieved. FIG. 5 in this regard illustrate the top view of the structure of FIG. 4. The exemplary mask 60 on top of second layer us used to structure the optoelectronic device.

The above examples can be combined by the skilled person in various ways without deviating from the gist and scope of the invention. The subsequent deposition of Mg and Zn as two different p-dopants result in a steep flank of Zn within the second layer. By adjusting the diffusion parameters, the flank can be localized close to the barrier or active region. The steep flank enable the increase of current through the device thereby improving its efficiency.

The invention claimed is:

1. A method for manufacturing a semiconductor device, the method comprising:
   providing a growth substrate;
   depositing an n-doped first layer;
   depositing an active region on the n-doped first layer;
   depositing a p-doped second layer on the active region, wherein a p-doped material comprises magnesium (Mg); and
   depositing zinc (Zn) on a surface of the p-doped second layer such that Zn partly or fully replaces Mg atoms in the second layer and such that a concentration of Zn in the second layer decreases from a first value to a second value in a first area of the second layer adjacent to the active region, the first area being in a range of 5 nm to 200 nm.

2. The method according to claim 1, wherein, after diffusion of Zn through the second layer, the concentration of Zn in a second area adjacent to the first area is larger than a respective concentration of Mg in the second area.

3. The method according to claim 1, wherein the first value is 5 to 500 times larger than the second value.

4. The method according to claim 1, wherein the second value is substantially equal to a concentration of Mg in the first area.

5. The method according to claim 1, wherein the second layer comprises a thickness of 300 nm to 5 µm.

6. The method according to claim 1, wherein a deposition of Mg comprises adjusting diffusion parameters causing a diffusion length of Mg to be substantially shorter than a distance from a surface of the second layer to the first area or the active region.

7. The method according to claim 1, wherein depositing Zn comprises at least one of:
   adjusting a temperature, the temperature being different from a temperature while depositing Mg; or
   adjusting a diffusion time, the diffusion time being different from a diffusion time while depositing Mg.

8. The method according to claim 1, wherein a deposition of Mg or a depositing Zn comprises providing a photomask mask onto the second layer.

9. The method according to claim 1, wherein depositing the second layer comprises:
   depositing a third semiconductor layer having aluminium (Al), wherein a concentration of Al varies with increasing distance to the active region; and
   depositing a second semiconductor layer onto the third semiconductor layer.

10. The method according to claim 1, wherein depositing the active region comprises depositing layers having different material compositions as to form one or more quantum well structures.

11. The method according to claim 1, wherein the first layer and the second layer comprise InGaAlP or InAlP.

12. The method according to claim 1, wherein the first area is less than 50 nm.

13. The method according to claim 1, wherein the second layer comprises a thickness of larger than 500 nm.

* * * * *